(12) United States Patent
Winkler et al.

(10) Patent No.: US 10,249,472 B2
(45) Date of Patent: Apr. 2, 2019

(54) CHARGED PARTICLE BEAM DEVICE, CHARGED PARTICLE BEAM INFLUENCING DEVICE, AND METHOD OF OPERATING A CHARGED PARTICLE BEAM DEVICE

(71) Applicant: ICT Integrated Circuit Testing Gesellschaft für Halbleiterprüftechnik mbH, Heimstetten (DE)

(72) Inventors: Dieter Winkler, München (DE); Guy Eytan, Kidron (IL); Zvi Nir, Karmei Yosef (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 0 days.

(21) Appl. No.: 15/648,931

(22) Filed: Jul. 13, 2017

(65) Prior Publication Data
US 2019/0019649 A1    Jan. 17, 2019

(51) Int. Cl.
| H01J 37/09 | (2006.01) |
| --- | --- |
| H01J 37/21 | (2006.01) |
| H01J 37/145 | (2006.01) |
| H01J 37/147 | (2006.01) |
| H01J 37/28 | (2006.01) |
| H01J 37/244 | (2006.01) |

(52) U.S. Cl.
CPC ............ *H01J 37/145* (2013.01); *H01J 37/09* (2013.01); *H01J 37/1477* (2013.01); *H01J 37/21* (2013.01); *H01J 37/244* (2013.01); *H01J 37/28* (2013.01); *H01J 2237/0453* (2013.01); *H01J 2237/2448* (2013.01); *H01J 2237/24475* (2013.01)

(58) Field of Classification Search
CPC ........ H01J 37/09; H01J 37/05; H01J 37/1474; H01J 2237/0453; H01J 2237/1205; H01J 2237/2817; H01J 2237/04756; H01J 2237/1546
USPC .............. 250/310, 492.23, 311, 370.14, 394, 250/396 ML, 396 R, 398, 492.22
See application file for complete search history.

(56) References Cited

U.S. PATENT DOCUMENTS

| 3,581,136 A * | 5/1971 | Staunton ............... H01J 9/2272 313/472 |
| --- | --- | --- |
| 5,905,267 A * | 5/1999 | Muraki .................. B82Y 10/00 250/492.22 |

(Continued)

*Primary Examiner* — David A Vanore
(74) *Attorney, Agent, or Firm* — Kilpatrick Townsend & Stockton LLP (57) ABSTRACT

A charged particle beam device is described, which includes: a beam source configured to generate a charged particle beam propagating along an optical axis (A); an aperture device with a first number of apertures configured to create a first number of beamlets from the charged particle beam, wherein the first number is five or more, wherein the apertures are arranged on a ring line around the optical axis (A) such that perpendiculars of the apertures onto a tangent of the ring line are evenly spaced. The charged particle beam device further includes an electrostatic multipole device configured to individually influence the beamlets. Further, a charged particle beam influencing device and a method of operating a charged particle beam device are described.

18 Claims, 5 Drawing Sheets

(56) References Cited

U.S. PATENT DOCUMENTS

| | | | | |
|---|---|---|---|---|
| 9,035,249 B1* | 5/2015 | Frosien | ............... | H01J 37/05 250/310 |
| 2002/0105997 A1* | 8/2002 | Zhang | ............... | H01S 3/0941 372/70 |
| 2005/0047728 A1* | 3/2005 | Tobiason | ........... | G01D 5/34723 385/89 |
| 2008/0054196 A1* | 3/2008 | Hiroshima | ............. | B82Y 10/00 250/492.23 |
| 2010/0055580 A1* | 3/2010 | Fujimura | ............... | B82Y 10/00 430/5 |
| 2013/0270438 A1* | 10/2013 | Lanio | ..................... | H01J 37/09 250/310 |
| 2017/0148609 A1* | 5/2017 | Cook | ................... | H01J 37/147 |

* cited by examiner

CHARGED PARTICLE BEAM DEVICE, CHARGED PARTICLE BEAM INFLUENCING DEVICE, AND METHOD OF OPERATING A CHARGED PARTICLE BEAM DEVICE

TECHNICAL FIELD

Embodiments described herein relate to charged particle beam devices, and particularly to scanning electron microscopes configured to inspect specimens such as wafers or other substrates, e.g. to detect pattern defects. More specifically, embodiments described herein relate to charged particle beam devices configured to utilize multiple charged particle beams, e.g. electron beams, particularly for inspection system applications, testing system applications, defect review or critical dimensioning applications, surface imaging applications or the like. Embodiments further relate to charged particle beam influencing devices and to methods of operating charged particle beam devices.

BACKGROUND

Modern semiconductor technology has created a high demand for structuring and probing specimens in the nanometer or even in the sub-nanometer scale. Micrometer and nanometer scale process control, inspection or structuring is often done with charged particle beams, e.g. electron beams, which are generated, shaped, deflected and focused in charged particle beam devices, such as electron microscopes. For inspection purposes, charged particle beams offer superior spatial resolution compared to, e.g., photon beams, because their wavelengths are shorter than the wavelengths of light beams.

Inspection devices using charged particle beams such as scanning electron microscopes (SEM) have many functions in a plurality of industrial fields, including, but not limited to, inspection of electronic circuits, exposure systems for lithography, detecting devices, defect inspection tools, and testing systems for integrated circuits. In such charged particle beam systems, fine probes with high current density can be used. For instance, in the case of an SEM, the primary electron (PE) beam generates signal particles like secondary electrons (SE) and/or backscattered electrons (BSE) that can be used to image and analyze a specimen.

One drawback of electron-beam based systems is the limited probe current within the focused spot. With increasing resolution (decreasing spot size), the probe current is further decreased because of a reduced aperture angle for controlling the aberrations. Higher brightness sources can provide only limited improvements for the probe current due to the electron-electron interactions. Many approaches have been made to reduce e-e interactions in electron beam systems, which are, for example, reduced column length and/or higher column energy combined with late deceleration of the electron beam to the final landing energy just in front of the sample. However, improving the electron beam throughput at a high resolution is increasingly challenging.

One approach to solve such problems is the use of multiple beams (also referred to herein as beamlets) in a single column. Directing, scanning, deflecting, shaping, correcting, and/or focusing the individual beamlets of a multi-beam system is, however, challenging, in particular when sample structures are to be scanned and inspected in a quick manner with a high throughput on a nanoscale resolution.

Accordingly, it would be beneficial to provide charged particle beam devices configured as multi-beam systems which provide a high throughput and good field qualities to be used for inspecting sample structures. In particular, it would be beneficial to provide a charged particle beam device which is able to increase the data collection rate such that the device can be applied to high speed wafer inspection.

SUMMARY

In light of the above, according to the independent claims, a charged particle beam device, a charged particle beam influencing device as well as methods of operating a charged particle beam device are provided. Further aspects, advantages, and features of the embodiments are apparent from the dependent claims, the description, and the accompanying drawings.

According to one aspect described herein, a charged particle beam device is provided. The charged particle beam device includes a beam source configured to generate a charged particle beam propagating along an optical axis; an aperture device with a first number of apertures configured to create a first number of beamlets from the charged particle beam, wherein the first number is five or more, and wherein the apertures are arranged on a ring line around the optical axis such that perpendiculars of the apertures onto a tangent of the ring line are evenly spaced; and an electrostatic multipole device configured to individually influence the beamlets.

According to a further aspect described herein, a scanning electron microscope (SEM) for imaging a specimen is provided. The scanning electron microscope includes a beam source configured to generate a beam of primary electrons propagating along an optical axis; an aperture device with a first number of apertures configured to create a first number of beamlets from the charged particle beam; an electrostatic multipole device configured to individually influence the beamlets; and a scanning device configured for scanning the beamlets over the specimen in a first scan direction along evenly spaced scan lines. The apertures of the aperture device are arranged on a ring line around the optical axis.

According to a further aspect described herein, a charged particle beam influencing device is provided. The charged particle beam influencing device includes an aperture device with a first number of apertures configured to create a first number of beamlets from a charged particle beam propagating along an optical axis, wherein the first number is five or more, and wherein the apertures are arranged on a ring line around the optical axis such that perpendiculars of the apertures onto a tangent of the ring line are evenly spaced; and an electrostatic multipole device integrated with the aperture device and configured for individually influencing the beamlets.

According to a further aspect described herein, a method of operating a charged particle beam device is provided. The method includes generating a charged particle beam propagating along an optical axis; directing the charged particle beam through a first number of apertures arranged on a ring line around the optical axis to create a first number of beamlets, wherein the first number is five or more; individually influencing the beamlets; and moving the beamlets relative to a specimen in a first scan direction along evenly spaced scan lines.

Embodiments are also directed at apparatuses for carrying out the disclosed methods and include apparatus parts for performing the individual method actions. The methods may be performed by way of hardware components, a computer programmed by appropriate software, by any combination of the two or in any other manner. Furthermore, embodiments are also directed at methods of operating the described apparatuses.

Further advantages, features, aspects and details that can be combined with embodiments described herein are evident from the dependent claims, the description and the drawings.

BRIEF DESCRIPTION OF THE DRAWINGS

So that the manner in which the above recited features of the present invention can be understood in detail, a more particular description of embodiments, briefly summarized above, may be had by reference to embodiments. The accompanying drawings relate to one or more embodiments and are described in the following.

DETAILED DESCRIPTION

Reference will now be made in detail to the various embodiments, one or more examples of which are illustrated in the figures. Within the following description of the drawings, the same reference numbers refer to the same components. Generally, only the differences with respect to individual embodiments are described. Each example is provided by way of explanation and is not meant as a limitation. Further, features illustrated or described as part of one embodiment can be used on or in conjunction with other embodiments to yield yet a further embodiment. It is intended that the description includes such modifications and variations.

Semiconductor technology is dependent on an accurate control of the various processes used during the production of integrated circuits. For example, substrates such as wafers and masks have to be inspected repeatedly, in order to localize problems or defects. A mask or reticle has to be inspected before actual use during substrate processing, in order to make sure that the mask accurately defines a predetermined pattern. Any defect in the mask pattern would be transferred to the substrate during use in microlithography. The inspection of a specimen such as substrates, wafers or masks for defects typically includes the examination of a large surface area in a comparably short time. The inspection should be as fast as possible, in order to avoid a reduction of the production throughput by the inspection process.

Scanning electron microscopes (SEMs) can be used to inspect a specimen to detect defects such as pattern defects. The surface of the specimen is scanned using a charged particle beam, e.g. an electron beam, which may be focussed on the surface of the specimen. When the charged particle beam hits the specimen, secondary charged particles (e.g., secondary electrons) are generated and detected. A pattern defect at a location of the specimen can be detected by comparing an intensity signal of the secondary charged particles to, e.g., a reference signal corresponding to the same location of the specimen. When only one charged particle beam is used for scanning, scanning may take a considerable amount of time, and only a limited throughput may be obtainable.

The throughput may be increased by providing a charged particle beam device configured as a multi-beam system. In a multi-beam system, a plurality of beamlets of charged particles are generated which propagate next to each other in a column so that two or more spots on the specimen can be inspected simultaneously. However, controlling, shaping and correcting a plurality of beamlets which propagate at a close relative distance in one column is challenging. According to embodiments described herein, a charged particle beam device 100 is provided which provides a high throughput and a high inspection accuracy at the same time.

Figure 1:
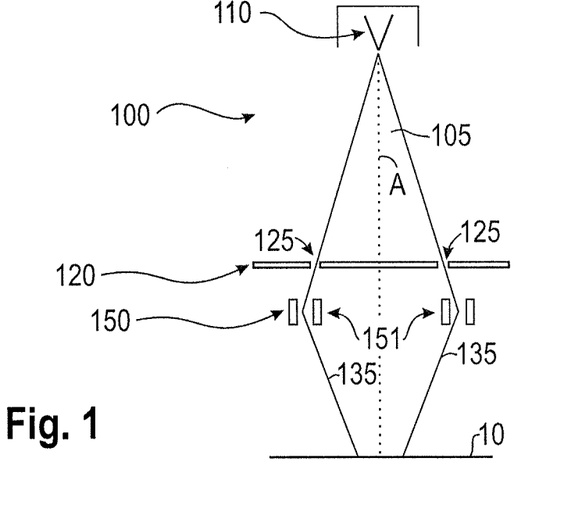
FIG. 1 is a schematic sectional view of a charged particle beam device according to embodiments described herein.

FIG. 1 is a schematic sectional view of a charged particle beam device 100 configured as a multi-beam system according to embodiments described herein.

The charged particle beam device 100 includes a beam source 110 configured to generate a charged particle beam 105 propagating along an optical axis A. The beam source 110 may be an electron source configured to generate an electron beam. The charged particle beam 105 may propagate from the beam source 110 toward a specimen 10 through a column along the optical axis which may be located at the center of the column. A plurality of beam influencing elements such as one or more deflectors, beam correctors, lens devices, apertures, beam benders and/or beam separators (not shown in FIG. 1) may be arranged along the beam path between the beam source and the specimen.

In some embodiments, the beam source 110 may include at least one of a cold field emitter (CFE), a Schottky emitter, a TFE or another high current e-beam source, e.g. to increase the throughput. A high current is considered to be 10 μA in 100 mrad or above, for example up to 5 mA, e.g. 30 μA in 100 mrad to 1 mA in 100 mrad. According to typical implementations, the current is distributed essentially uniformly, e.g. with a deviation of +/−10%. According to some embodiments, which can be combined with other embodiments described herein, the source can have a diameter of 2 nm to 40 nm and/or have a typical emission half angle of 5 mrad or above, e.g. 50 mrad to 200 mrad.

According to embodiments, which can be combined with other embodiments described herein, a TFE or another high reduced-brightness source, e.g. an e-beam source, capable of providing a large beam current is a source where the brightness does not fall by more than 20% of the maximum value when the emission angle is increased to provide a maximum of 10 μA-100 μA, for example 30 μA. Schottky or TFE emitters are currently available with a measured reduced-brightness of $5 \cdot 10^7$ $Am^{-2}(SR)^{-1}V^{-1}$, and CFE emitters have a measured reduced-brightness of up to $5 \cdot 10^9$ $Am^{-2}(SR)^{-1}V^{-1}$. The system may also work with a carbide emitter such as a HfC which can have a reduced brightness of approximately $1 \cdot 10^{11}$ $Am^{-2}(SR)^{-1}V^{-1}$. For example, a beam which has at least $5 \cdot 10^7$ $Am^{-2}(SR)^{-1}V^{-1}$ is beneficial.

The charged particle beam device 100 further includes an aperture device 120 with a first number of apertures 125 configured to create a first number of beamlets 135 from the charged particle beam 105, wherein the first number is five or more. In other words, the aperture device 120 includes five or more apertures configured to create five or more beamlets. In other embodiments, the aperture device 120 may have eight or more apertures configured to create eight or more beamlets. Each of the apertures of the aperture device 120 may be configured to create one beamlet of charged particles from the charged particle beam.

The aperture device 120 may include a substrate, e.g. a flat plate, wherein the apertures 125 are formed as openings or holes in the substrate. When the charged particle beam 105 impinges on the substrate having the apertures 125 formed therein, charged particles can propagate through the apertures 125 in the substrate to form the beamlets 135, and a remaining part of the charged particle beam 105 may be blocked by the substrate. At least one surface of the aperture device 120, e.g. the surface of the aperture device 120 directed toward the beam source 110, may be a conductor or semiconductor surface in order to reduce or avoid an accumulation of charges on the aperture device 120.

Figure 2:
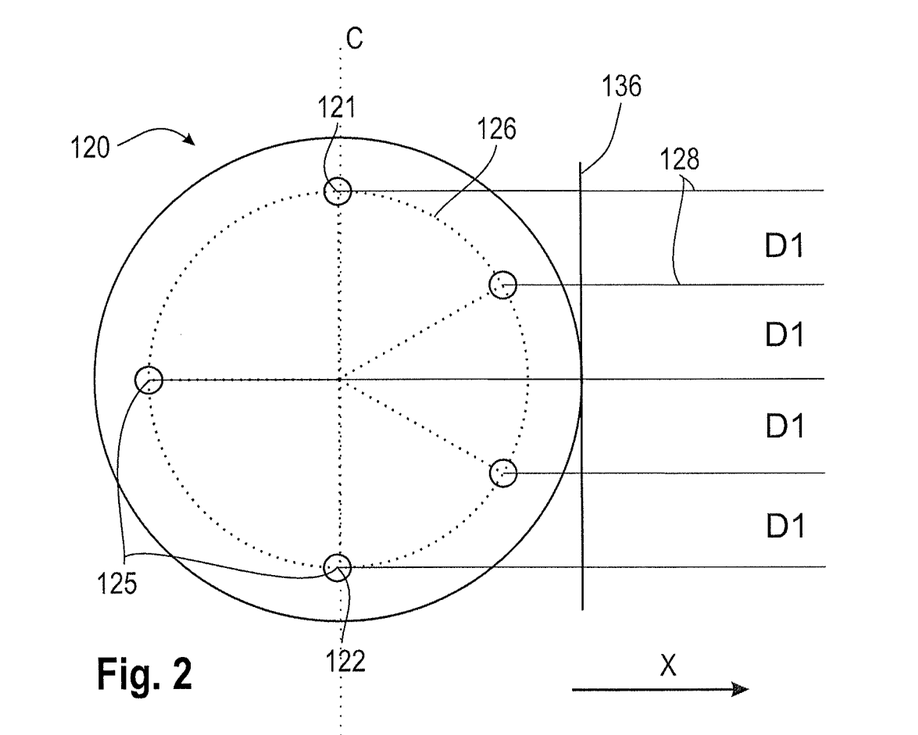
FIG. 2 is a schematic bottom view of an aperture device of a charged particle beam device according to embodiments described herein.

FIG. 2 shows the aperture device 120 in more detail in a bottom view, i.e. from the perspective of the specimen 10. As is shown in FIG. 2, the five or more apertures of the aperture device are arranged on a ring line 126 around the optical axis A. The ring line 126 is typically, but not necessarily, a circular line. Accordingly, the five or more beamlets that are generated by directing the charged particle beam 105 through the aperture device 120 may have essentially the same distance from the optical axis A. Generating the beamlets such that the beamlets have the same distance from the optical axis A may have the advantage that influencing the beamlets causes similar aberrations of the individual beamlets, which can therefore be corrected more easily. Further, the beamlets 135 can be focused onto the specimen 10 with one single objective lens which focuses each of the beamlets in a corresponding way.

In the sectional view of FIG. 1, only two beamlets of the five or more beamlets are depicted. For example, the sectional view of FIG. 1 may be taken along the sectional plane C that is indicated in FIG. 2 as a dashed line. Accordingly, the two apertures which are shown in FIG. 1 may correspond to a first aperture 121 and a second aperture 122 of the aperture device 120 of FIG. 2, which are located on opposite sides of the ring line 126. The remaining three or more beamlets that are created by the aperture device 120 are not illustrated in FIG. 1.

The apertures 125 are arranged on the ring line 126 around the optical axis A such that perpendiculars 128 of the apertures 125 onto a tangent 136 of the ring line 126 are evenly spaced. A "perpendicular of an aperture" may be understood as a connection line between a center of the aperture and the tangent 136, wherein the connection line is perpendicular to the tangent 136. The perpendiculars 128 are parallel to each other, each perpendicular being perpendicular to a common tangent. The distances D1 between two adjacent perpendiculars 128 are essentially equal, respectively.

Accordingly, the beamlets 135 can be scanned over the specimen in a first scan direction X (corresponding to the direction of the perpendiculars 128 in FIG. 1) along a first number of evenly spaced scan lines.

It is to be noted that the direction of the perpendiculars 128 does not necessarily correspond to the first scan direction X. For example, the beamlets 135 may be rotated in unison around the optical axis by a magnetic lens element which may be arranged between the aperture device 120 and the specimen 10. A common rotation around the optical axis A maintains the relative distance between the beamlets such that the beamlets are still evenly spaced in a (rotated) projection after the rotation.

According to embodiments described herein, a multi-beam system is provided where the beamlets are located on a ring line around the optical axis A. The optical axis A may correspond to the center of the column. Even though the first number of beamlets which are arranged on the ring line is five or more, the beamlets are evenly spaced in the projection such that the beamlets can be scanned along essentially equidistant scan lines in a first scan direction X.

It is to be noted that the five or more beamlets can only be evenly spaced in the projection when the five or more apertures are not arranged at evenly spaced angular positions with respect to the optical axis on the ring line 126. In the example depicted in FIG. 2, some adjacent apertures enclose an angle of 90° with respect to the center of the aperture device, whereas other adjacent apertures enclose an angle of 45°. However, in the projection, the distances D1 between the generated beamlets are essentially equal. Similarly, in the example depicted in FIG. 4 with a first number of eight (i.e. eight apertures for creating eight beamlets), the apertures are arranged at unevenly spaced angular positions such that, in the projection, scanning of the beamlets along evenly spaced scan lines is possible.

When beamlets are scanned along scan lines which are not evenly spaced, there is a loss in throughput, as at a certain point the areas scanned by some close beamlets may overlap, while other stripes may remain unscanned. This leads to a loss in throughput, because during the time for scanning the unscanned areas, some beamlets may be idle.

On the other hand, according to embodiments described herein, the beamlets can be scanned along evenly spaced scan lines, i.e. along equidistant scan lines. An increased throughput can be achieved, e.g. by first scanning the beamlets along the evenly spaced scan lines in the first scan direction X, followed by a movement of the beamlets in a transverse second scan direction until a predetermined area of the specimen has been completely scanned. Idle times of some of the beamlines can be reduced or entirely avoided. Thereafter, the specimen may be moved or shifted, whereupon a further area of the specimen can be raster-scanned.

According to some embodiments, the charged particle beam device may include a scanning device configured to scan the beamlets 135 over the specimen 10 in the first scan direction X along the evenly spaced scan lines. Optionally, the scanning device may be configured to deflect the beamlets 135 in a second transversal scan direction which may be perpendicular to the first scan direction X.

The charged particle beam device 100 further includes an electrostatic multipole device 150 configured to individually influence the beamlets 135. In some embodiments, the electrostatic multipole device 150 is arranged downstream from the aperture device 120 and includes a plurality of electrostatic multipoles 151 configured to influence the beamlets 135 individually, i.e. each beamlet can be influenced by an associated electrostatic multipole.

"Influencing a beamlet" as used herein may be understood as at least one or more of deflecting, shaping, correcting, focusing and/or collimating the beamlet. For example, the electrostatic multipole device 150 may include a plurality of electrostatic deflector units, wherein each deflector unit may be configured to deflect one of the beamlets 135. For example, the electrostatic multipole device may include a plurality of electrostatic quadrupoles or octupoles, wherein each electrostatic quadrupole or octupole may be configured to correct aberrations of one of the beamlets 135.

The electrostatic multipole device may be configured to influence each of the beamlets individually. For example, the electrostatic multipole device may have a first number of electrostatic multipoles, wherein each electrostatic multipole is associated to one of the first number of beamlets such that said beamlet can be influenced individually via the associated electrostatic multipole. In particular, each of the beamlets can be influenced essentially independently of the other beamlets by an associated electrostatic multipole of the electrostatic multipole device. In some embodiments, the electrostatic multipole device 150 may have the first number of electrostatic multipoles 151 corresponding to the first number of beamlets such that each beamlet can be influenced independently of the other beamlets, wherein the first number is five or more.

The electrostatic multipole device 150 is arranged downstream from the aperture device 120. For example, the electrostatic multipole device 150 may be arranged directly downstream from the aperture device, i.e. without another beam influencing unit between the aperture device and the electrostatic multipole device, as is exemplarily depicted in FIG. 1. In some embodiments, the electrostatic multipole device 150 may be integrated with the aperture device 120, as is exemplarily depicted in FIG. 3.

Providing an electrostatic multipole device 150 downstream from the aperture device 120 is beneficial because the beamlets, after creation by the aperture device, can be deflected, focused and/or corrected such that the beamlets accurately propagate toward a predetermined spot on the specimen. Individually influencing the beamlets after the creation of the beamlets is particularly beneficial in cases where the angular distances between adjacent beamlets are not equal. This is because collectively influencing all the beamlets with a single electrostatic field may provide a reduced deflection accuracy and/or correction accuracy as compared to individually influencing the beamlets. Accordingly, the throughput may be further increased by individually influencing the beamlets. Further, an electrostatic multipole device 150 configured to individually influence the beamlets provides increased adjustment and flexibility options such that the beam paths and beam shapes can be corrected and adjusted more easily and accurately.

In some embodiments, an electrostatic multipole 151 of the electrostatic multipole device 150 may be configured as an electrostatic dipole, quadrupole, hexapole or octupole. The electrostatic multipole device 150 may include one associated electrostatic dipole, quadrupole, hexapole or octupole for each beamlet 135.

An electrostatic dipole includes two electrodes for influencing a beamlet of charged particles, wherein the two electrodes may be arranged on opposite sides of the beamlet. An electrostatic dipole may be used for deflecting a beamlet in one direction perpendicular to the beam propagation direction.

An electrostatic quadrupole includes four electrodes for influencing a beamlet of charged particles, wherein the four electrodes may be arranged at equal angular positions around the beamlet. An electrostatic quadrupole may be used for deflecting a beamlet in two directions perpendicular to the beam propagation direction and/or for correction of beam aberrations.

An electrostatic octupole includes eight electrodes for influencing a beamlet of charged particles, wherein the eight electrodes may be arranged at equal angular positions around the beamlet. An electrostatic octupole may be used for deflecting a beamlet in various directions and/or for correction of beam aberrations. Higher order aberration as compared to an electrostatic quadrupole can be corrected.

It is to be noted that electrostatic multipoles may also be useable for beam focusing and/or defocusing, e.g. by applying corresponding electric potentials to the electrodes of the electrostatic multipole.

In some embodiments, the electrostatic multipoles 151 of the electrostatic multipole device 150 include two, four, six, eight or more electrodes arranged downstream from an associated aperture at evenly spaced angular positions with respect to a center of the associated aperture, respectively. The electrostatic multipoles 151 may be configured for at least one of individually deflecting, correcting, shaping and/or focusing one associated beamlet, respectively.

As is shown in FIG. 2, a distance D1 between two adjacent perpendiculars 128 may essentially correspond to a maximum diameter of the ring line 126 divided by the number of apertures minus 1. For example, when the first number is five, the distance D1 between two adjacent perpendiculars 128 may correspond to a quarter of the diameter of the ring line 126, as is schematically depicted in FIG. 2. Such an arrangement of apertures on the ring line 126 is beneficial, because a large area, e.g. a broad stripe, on the specimen can be scanned before the specimen is to be shifted.

In some embodiments, a scanning device configured for scanning the beamlets over a specimen along the evenly spaced scan lines in the first scan direction X may be provided. The first scan direction X is typically set in accordance with the direction of the perpendiculars. For example, the scanning device may be configured to raster-scan the beamlets over the specimen by alternately scanning in the first scan direction X along the evenly spaced scan lines and moving the beamlets in a second transversal scan direction. The second transversal scan direction may be perpendicular to the first scan direction. This sequence may be repeated until a stripe of the specimen with a width corresponding to or larger than the diameter of the ring line 126 has been scanned completely. Thereupon, the specimen may be shifted to another position, e.g. by a distance corresponding to the width of the previously scanned stripe.

In some embodiments, which can be combined with other embodiments described herein, the electrostatic multipole device 150 may be configured to deflect the beamlets 135 such that each beamlet appears to come from a different source. For example, the electrostatic multipole device 150 may include an individual deflector for each of the beamlets, as is schematically depicted in FIG. 1. In particular, the individual deflectors may include electrostatic multipoles such as electrostatic dipoles, quadrupoles, hexapoles or octupoles. Providing an electrostatic multipole device 150 with a plurality of electrostatic quadrupoles or octupoles may be beneficial, because electrostatic quadrupoles or octupoles can be utilized for focusing, deflecting and correcting.

Figure 3:
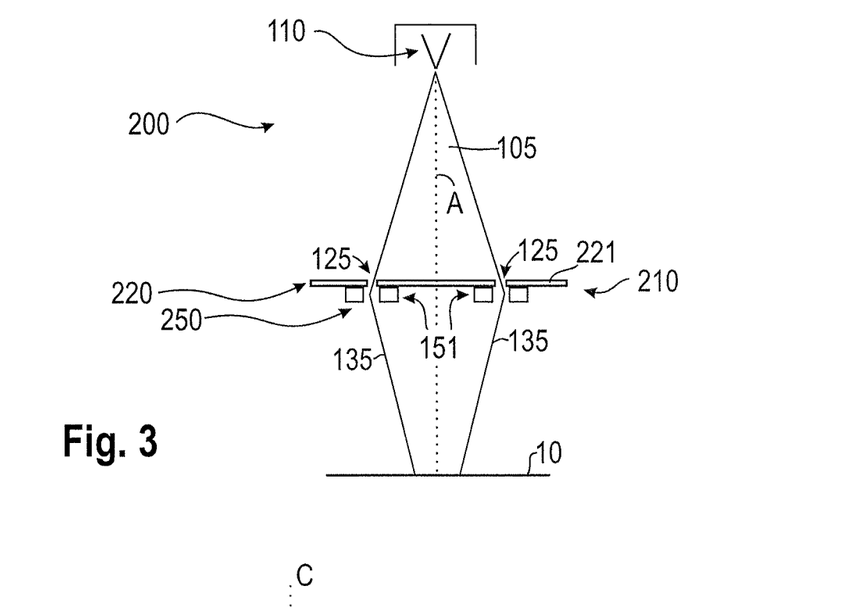
FIG. 3 is a schematic sectional view of a charged particle beam device according to embodiments described herein.

FIG. 3 is a schematic sectional view of a charged particle beam device 200 according to embodiments described herein. The charged particle beam device 200 of FIG. 3 may include most of the features of the charged particle beam device 100 of FIG. 1, such that reference can be made to the above explanations which are not repeated here.

The charged particle beam device 200 includes a beam source 110 for generating a charged particle beam 105 which propagates from the beam source 110 through a column toward a specimen 10 to be inspected. The charged particle beam device 200 further includes a charged particle beam influencing device 210.

Figure 4:
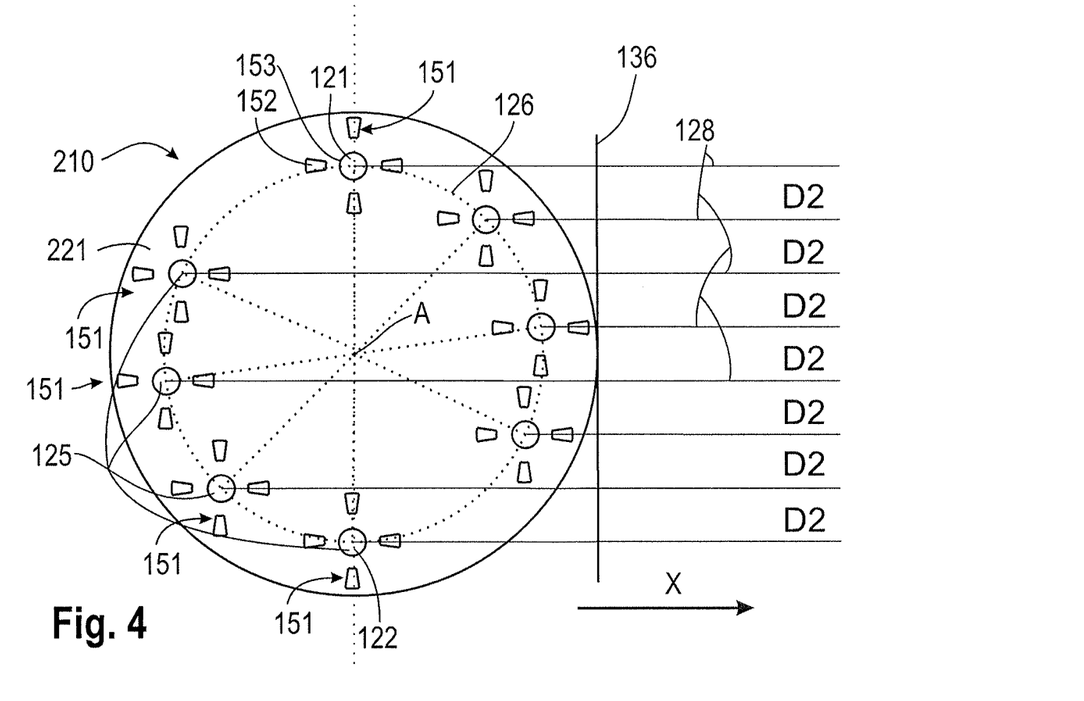
FIG. 4 is a schematic bottom view of a charged particle beam influencing device according to embodiments described herein.

FIG. 4 shows the charged particle beam influencing device 210 in more detail in a bottom view, i.e. from the perspective of the specimen 10. The charged particle beam influencing device 210 includes an aperture device 220 and an electrostatic multipole device 250 which may be integrally formed. In other words, the aperture device 220 and the electrostatic multipole device 250 may be integrally formed as a single component, i.e. may be connected or fixed to each other, or may be formed from a single multilayer substrate.

In some embodiments, which may be combined with other embodiments described herein, the aperture device 220 includes a substrate 221 including an insulator layer on which the electrostatic multipoles 151 of the electrostatic multipole device 250 are formed.

A first number of apertures 125 is formed in the substrate 221 of the aperture device 220, wherein the first number is five or more. In the embodiment of FIG. 4, the first number is eight. The apertures 125 are configured to create a first number of beamlets 135 from the charged particle beam 105. Accordingly, the aperture device 220 of FIG. 4 is configured to create eight beamlets. In other embodiments, the first number may be larger than eight, e.g. ten or more.

As is shown in FIG. 4, the apertures 125 are arranged on a ring line 126 around the optical axis A such that perpendiculars 128 of the apertures 125 onto a tangent 136 of the ring line 126 are evenly spaced. Accordingly, the distance D2 between adjacent beamlets in the projection is similar or identical, respectively. The distance D2 may approximately correspond to the diameter of the ring line 126 divided by seven (eight minus 1).

It is thus possible to scan the beamlets 135 over the specimen 10 along evenly spaced or equidistant scan lines in a first scan direction X. Reference is made to the above explanations which are not repeated here.

The electrostatic multipoles 151 of the electrostatic multipole device 250 may be arranged on a surface of the substrate 221 which is directed downstream, i.e. toward the specimen 10. Accordingly, a beamlet which has been created by propagating through one of the apertures may be influenced immediately after the creation, e.g. deflected, corrected and/or focused by an associated electrostatic multipole which may be formed on the substrate 221.

As is shown in detail in FIG. 4, the electrostatic multipole device 250 may include a first number of electrostatic multipoles 151 corresponding to the first number of apertures 125, i.e. eight electrostatic multipoles such as quadrupoles or octupoles. In the exemplary embodiments of FIG. 4, the electrostatic multipoles 151 are configured as quadrupoles.

An electrostatic multipole 151 may include four or more electrodes which may be formed on a main surface of the substrate 221 around one of the apertures for influencing one beamlet after propagation through the aperture. In some embodiments, each of the four or more electrodes may be arranged at the same distance from a center of the aperture. In some embodiments, each of the four or more electrodes may be arranged at a radial distance from a beam limiting edge of the aperture. For example, as is schematically depicted in FIG. 4, the electrode 152 is arranged at a radial distance from the beam limiting edge 153 of the first aperture 121. In other words, not the electrode 152 itself forms the beam limiting edge for the beamlet, but the electrode 152 is arranged radially outside with respect to the beam limiting edge 153 of the first aperture 121. As a result, the beamlet does not propagate through an edge region of the electric field of the electrostatic multipole where the electric field may deviate from the electric field in a center region of the aperture. The beam limiting edge 153 of an aperture limits the radial extension of the beamlet propagating through the aperture.

According to some embodiments, which may be combined with other embodiments described herein, the charged particle beam influencing device 210 includes a substrate 221 which is both configured for providing the apertures 125 for forming the beamlets and for carrying the electrodes of the electrostatic multipole device downstream from the apertures.

The electrodes of an electrostatic multipole 151 may be arranged on a surface of the substrate 221 at equally spaced angular positions with respect to one of the apertures. The substrate 221 may be a flat plate substrate, e.g. a wafer such as a multilayer wafer. For example, the substrate 221 may be a multilayer wafer with at least one insulator layer on which the electrodes are formed.

In some embodiments, which may be combined with other embodiments disclosed herein, the apertures may have a round or a circular cross-sectional shape. Thus, round or circular beamlets of charged particles can be generated by directing a wide-angle charged particle beam through the apertures. The apertures may have a diameter of 1 mm or less, particularly 500 µm or less, more particularly 200 µm or less, or even 100 µm or less.

The manufacture of the charged particle beam influencing device 210 according to embodiments disclosed herein can be simplified, when some or all of the electrodes of the electrostatic multipoles 151 include silicon or doped silicon.

Silicon electrodes arranged on top of a flat substrate may be formed in a particularly easy way in a miniaturized form from an SOI substrate (Silicon-on-Insulator). The conductivity of crystalline silicon or doped silicon may be sufficient to form electrodes of an electrostatic multipole therefrom. In other implementations, the electrodes of the electrostatic multipoles 151 can include a metal. Yet further, other material systems may be suitable to provide a multi-layer wafer structure with an insulator layer and a semiconductor layer similar to an SOI wafer.

The electrodes of the electrostatic multipoles 151 may be configured to be connectable to a respective electric potential. For example, a voltage supply may be provided to connect each of the electrodes with a respective voltage. In some cases, each electrode may be coupled to a respective connection line for connecting the electrode with the voltage supply. The connection lines may be at least partially integrated in an insulator layer of the substrate. In some embodiments, the connection lines may be provided at least partially on a surface of the substrate 221. For example, the connection lines for connecting the electrodes with a respective electric potential may be made from the same material as the electrodes.

Figure 6:
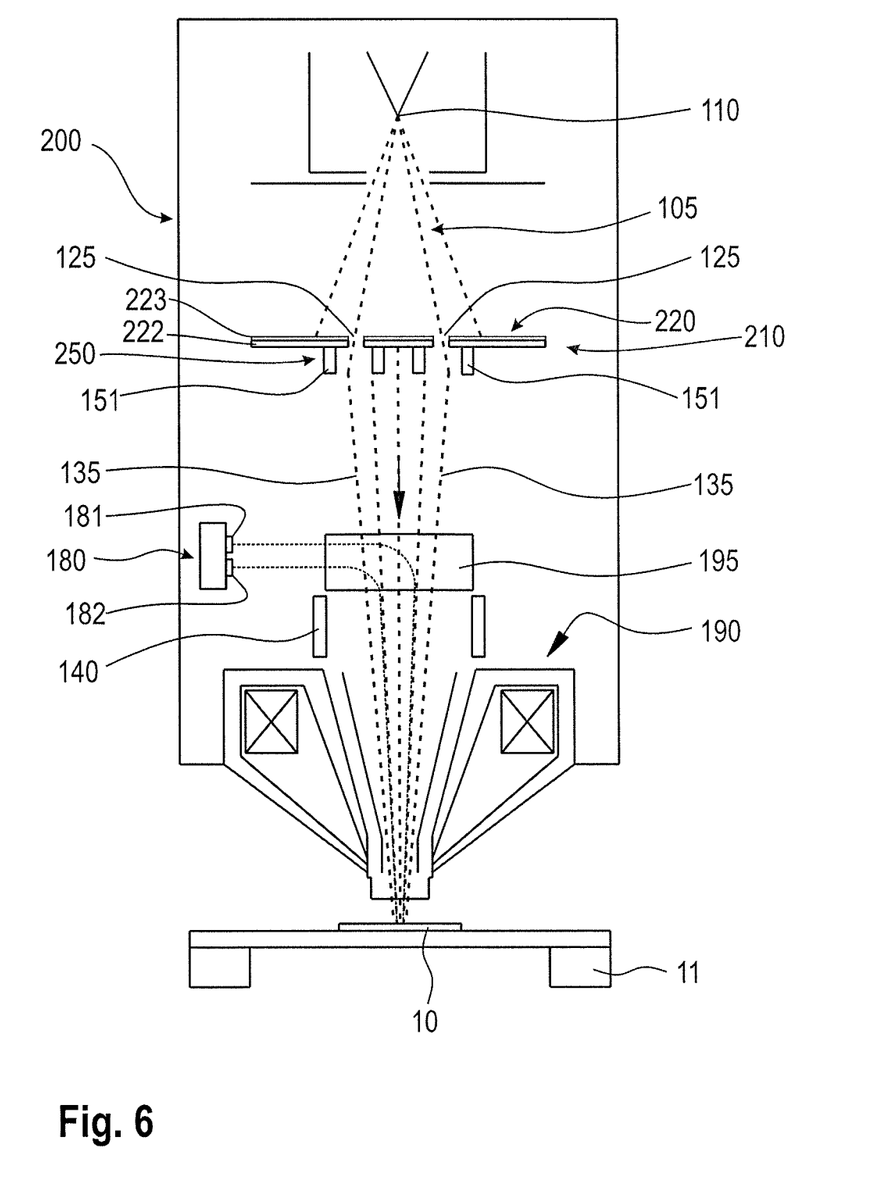
FIG. 6 is a schematic view of a charged particle beam device according to embodiments described herein.

In some embodiments, the substrate may include an insulator layer 222 on top of which the electrodes are formed, and the substrate may include a further layer 223 including a semiconductor or conductor material on the opposite side of the insulator layer 222 with respect to the side where the electrodes are formed (see FIG. 6). The further layer 223 may be directed to an upstream side of the charged particle beam influencing device 210. The further layer 223 may be made of a metal or a semiconductor, particularly silicon. In some implementations, both the electrodes and the further layer 223 may be made of silicon, whereas the insulator layer 222 may include $SiO_2$ or another insulator such as sapphire. An accumulation of charges on the surface of the substrate can be reduced or avoided. For example, the further layer 223 may be connected to an electric potential such as a ground potential.

The electrodes may be formed on the substrate 221 by applying a mask on a multilayer substrate and removing portions of an initially uniform top layer so that remaining portions of the top layer form the electrodes.

The electrodes may comprise or consist of silicon. In order to manufacture the electrodes, an initially uniform silicon layer which may be the top layer of an SOI-wafer can be partially removed, e.g. etched, to so that the remaining portions of the silicon layer form the electrodes. The electrodes may be essentially trapezoidally shaped and may be arranged at evenly spaced angular positions around the apertures, as is illustrated in FIG. 4. In some embodiments, which may be combined with other embodiments described herein, the electrodes may extend over an angular range of less than 30°, particularly less than 15°, around one of the apertures, respectively.

Figure 5:
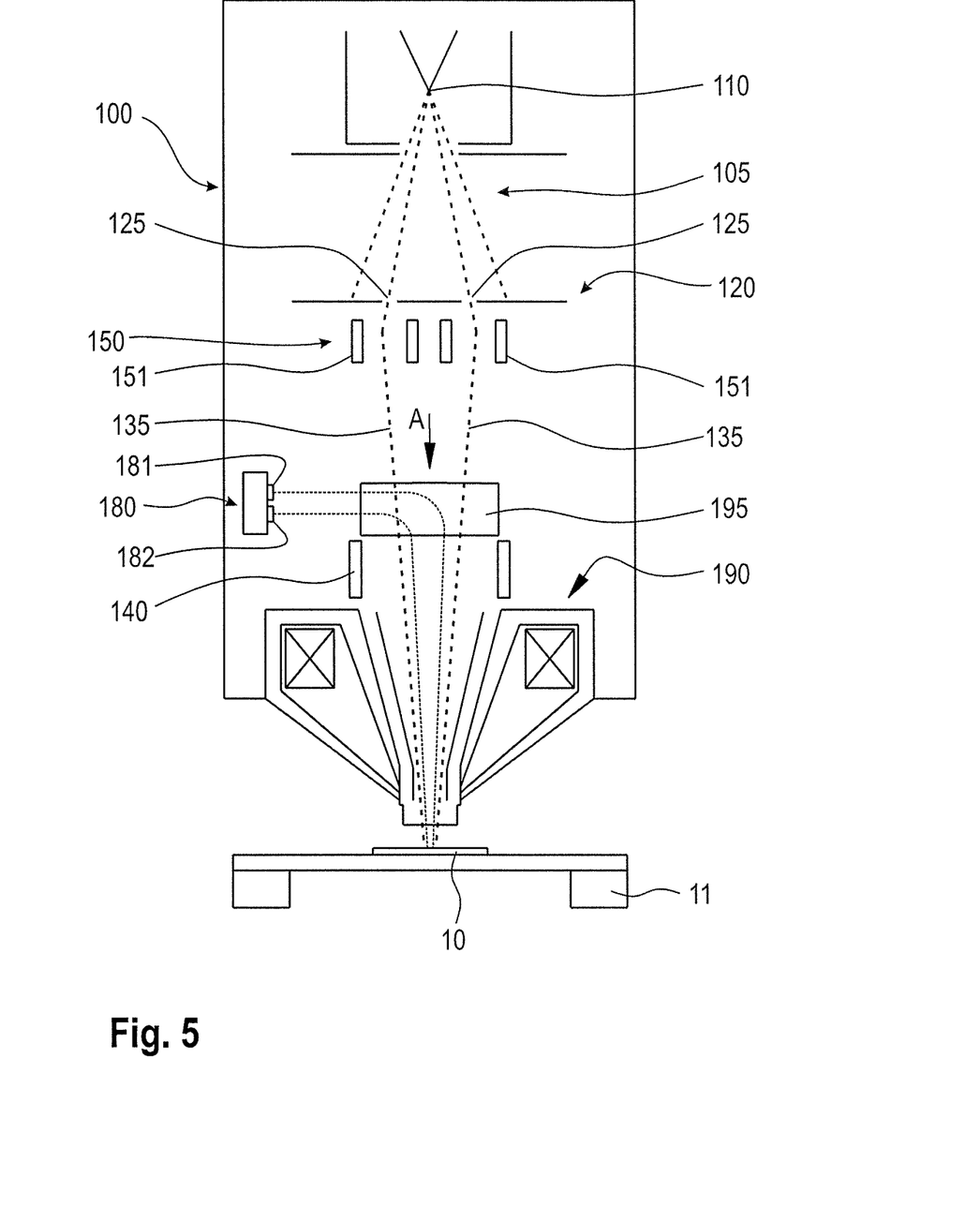
FIG. 5 is a schematic view of a charged particle beam device according to embodiments described herein.

FIG. 5 is a schematic sectional view of a charged particle beam device 100 according to embodiments described herein. The charged particle beam device 100 may include a beam source 110, an aperture device 120, and an electrostatic multipole device 150 similar to the embodiment depicted in FIG. 1, such that reference can be made to the above explanations which are not repeated here.

A charged particle beam 105 is generated by the beam source 110 and directed through the aperture device 120. The aperture device 120 is configured to form a first number of beamlets 135 from the charged particle beam. The first number is five or more, but only two beamlets 135 are shown in the sectional view of FIG. 5. The beamlets 135 propagate through the electrostatic multipole device 150. Each of the beamlets 135 may propagate through an associated electrostatic multipole 151 of the electrostatic multipole device 150 configured to individually influence the beamlet.

For example, the beamlets 135 may be deflected by the electrostatic multipole device such that each beamlet appears to come from a different source. Alternatively or additionally, beam aberrations of the beamlet may be corrected by applying an appropriate electrostatic multipole field.

The beamlets may optionally propagate through a beam separator device 195 configured to separate secondary electrons and/or backscattered electrons generated at the position of the specimen from the beamlets 135.

A scanning device 140 may be provided to scan the beamlets 135 over the specimen 10 in the first scan direction X and/or in a second transversal scan direction which may be perpendicular to the first scan direction X. The first scan direction X may be perpendicular to the sectional plane of FIG. 5. The five or more beamlets may be scanned along equidistant scan lines extending in the first scan direction X.

The charged particle beam device 100 may further include an objective lens 190 configured to focus the beamlets 135 onto a specimen 10. The objective lens 190 may be a combined magnetic-electrostatic objective lens including a magnetic lens portion and an electrostatic lens portion.

The electrostatic part of the compound magnetic-electrostatic lens may be an electrostatic retarding lens. Using such a compound magnetic-electrostatic lens yields superior resolution at low landing energies, such as a few hundred electron volts in the case of a SEM. Such low landing energies are beneficial, especially in modern semiconductor industry, to avoid charging and/or damaging of radiation sensitive specimens. However, in some cases, only a magnetic lens or only an electrostatic lens may be used.

The objective lens 190 may not only focus the beamlets, but may also rotate the beamlets around the optical axis. This effect is not shown because it is difficult to depict in a two-dimensional drawing and because the skilled person is well aware of this effect. Due to the combined effects of the electrostatic multipole device and the objective lens, multiple spots, each corresponding to one of the beamlets, are created on the specimen.

When the beamlets strike the surface of the specimen 10, the beamlets undergo a series of complex interactions with the nuclei and electrons of the atoms of the specimen. The interactions produce a variety of secondary products, such as electrons of different energy, X-rays, heat, and light. Many of these secondary products are used to produce the images of the sample and to collect additional data. A secondary product of major importance to examination or the image formation of the specimen are secondary electrons that escape from the specimen at a variety of angles with relatively low energy (1 to 50 eV). The signal electrons are extracted from the specimen through the objective lens, are separated from the primary beamlets, and reach a detector device.

Accordingly, the first number of beamlets 135 interact with the specimen 10 at a first number of spots such that a plurality of beamlets of secondary or backscattered electrons is emitted from the specimen 10.

The specimen 10 may be held on a movable stage 11 configured to move the specimen in at least one direction, e.g. in a direction perpendicular to the first scan direction X. In some embodiments, the movable stage 11 may be configured to move the specimen in two or more directions.

In some embodiments, the beam separator device 195 may be provided in order to separate the plurality of beamlets of secondary or backscattered electrons from the first number of beamlets 135. The beamlets of secondary or backscattered electrons may be directed toward a detector device 180.

In some embodiments, a detector device 180 configured to detect secondary charged particles and/or backscattered charged particles emitted from the specimen 10 may be provided. The detector device 180 may be subdivided into multiple segments configured to detect the secondary or backscattered electrons generated by one of the beamlets 135, respectively. For example, the detector device 180 depicted in FIG. 5 includes a first detector segment 181 configured to detect secondary charged particles generated by a first beamlet and a second detector segment 182 configured to detect secondary charged particles generated by a second beamlet. Further detector segments may be provided. The number of detector segments may correspond to the first number such that each beamlet has an associated detector segment.

FIG. 6 is a schematic sectional view of a charged particle beam device 200 according to embodiments described herein. The charged particle beam device 200 essentially corresponds to the charged particle beam device 100 depicted in FIG. 5, such that reference can be made to the above explanations which are not repeated here. However, instead of an aperture device and an electrostatic multipole device which are spatially separated from each other, a charged particle beam influencing device 210 as depicted in FIG. 4 may be provided.

The charged particle beam influencing device 210 includes an aperture device 220 with a first number of apertures configured to create the first number of beamlets 135 from the charged particle beam 105 and an electrostatic multipole device 250 which is integrally formed with the aperture device 220. The electrostatic multipole device 250 includes a plurality of electrostatic multipoles 151 configured to individually influence the beamlets 135.

The apertures 125 are arranged on a ring line around the optical axis A such that perpendiculars of the apertures onto a tangent of the ring line are evenly spaced. Accordingly, the beamlets can be scanned along equidistant scan lines in a first scan direction X.

The charged particle beam influencing device 210 may include a substrate having an insulator layer 222 on which the electrodes of the electrostatic multipoles 151 are formed and a further layer 223 which may be a conductor or semiconductor layer. The apertures 125 may be formed in the substrate, e.g. in an etching process.

Figure 7:
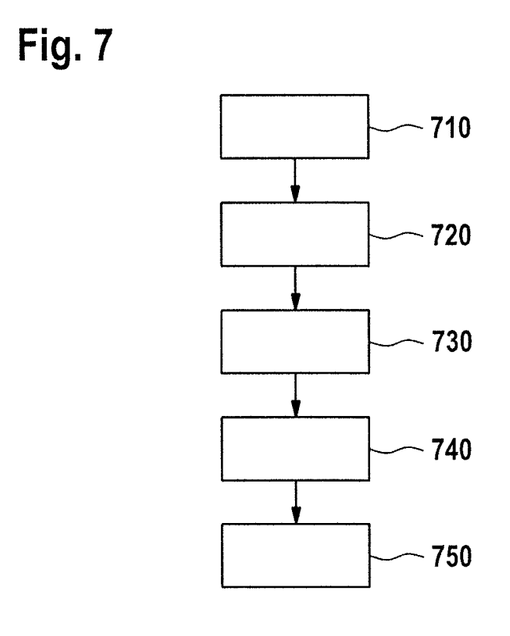
FIG. 7 is a flow diagram illustrating a method of operating a charged particle beam device according to embodiments described herein.

FIG. 7 is a flow diagram illustrating a method of operating a charged particle beam device according to embodiments described herein.

In box 710, a charged particle beam, particularly an electron beam, is created which propagates along an optical axis A.

In box 720, a first number of beamlets is created by directing the charged particle beam through a first number of apertures arranged on a ring line around the optical axis, wherein the first number is five or more.

In box 730, the beamlets are individually influenced, e.g. individually deflected, corrected, focused and/or shaped. For example, each beamlet may be influenced by an associated electrostatic multipole of an electrostatic multipole device.

The beamlets may be deflected by the electrostatic multipole device. Additionally or alternatively, beam aberrations of the beamlets may be corrected by the electrostatic multipole device.

In box 740, the beamlets are moved relative to the specimen in a first scan direction X along evenly spaced scan lines.

The specimen may be raster-scanned by moving the beamlets over the specimen in the first scan direction along the equidistant scan lines and in a transversal second scan direction. The transversal second scan direction may be perpendicular to the first scan direction. Raster-scanning in the first scan direction X and in the transversal second scan direction may be repeated until a predetermined area of the specimen has been scanned. Thereafter, the specimen may be moved, e.g. by a movable stage.

In box 750, the method may further include detecting secondary and/or backscattered charged particles emitted by the specimen, particularly wherein the secondary and/or backscattered charged particles generated by each of the beamlets are individually detected by a segment of a segmented detector device.

While the foregoing is directed to specific embodiments, other and further embodiments may be devised without departing from the basic scope thereof, and the scope thereof is determined by the claims that follow.

The invention claimed is:

1. A charged particle beam device, comprising:
a beam source configured to generate a charged particle beam propagating along an optical axis (A);
an aperture device with a first number of apertures configured to create a first number of beamlets from the charged particle beam, wherein the first number is five or more, and wherein the apertures are arranged on a ring line around the optical axis (A) such that perpendiculars of the apertures onto a tangent of the ring line are evenly spaced; and
an electrostatic multipole device configured to individually influence the beamlets, wherein the aperture device comprises a substrate on which electrostatic multipoles of the electrostatic multipole device are formed, and the electrostatic multipoles comprise four, six, eight, or more electrodes.

2. The charged particle beam device of claim 1, wherein the electrostatic multipoles are configured to individually influence the first number of beamlets.

3. The charged particle beam device of claim 1, wherein the electrostatic multipole device comprises a plurality of quadrupoles or octupoles.

4. The charged particle beam device of claim 1, wherein the four, six, eight or more electrodes of the electrostatic multipoles are arranged downstream from an associated aperture at evenly spaced angular positions with respect to a center of the associated aperture, respectively.

5. The charged particle beam device of claim 1, wherein a distance between two adjacent perpendiculars essentially corresponds to a diameter of the ring line divided by the first number minus 1.

6. The charged particle beam device of claim 1, further comprising:
a scanning device configured for scanning the beamlets over a specimen along evenly spaced scan lines in a first scan direction.

7. The charged particle beam device of claim 6, wherein the scanning device is configured to raster-scan the beamlets over the specimen by alternately scanning in the first scan direction along the evenly spaced scan lines and moving the beamlets in a second transversal scan direction.

8. The charged particle beam device of claim 1, wherein the electrostatic multipole device is configured to deflect the beamlets such that each of the beamlets appears to come from a different source.

9. The charged particle beam device of claim 8, wherein the electrostatic multipole device comprises an individual deflector for each of the beamlets.

10. The charged particle beam device of claim 9, wherein the individual deflector comprises an electrostatic multipole, particularly selected from the group consisting of an electrostatic quadrupole, hexapole and octupole.

11. The charged particle beam device of claim 1, further comprising:
an objective lens configured to focus the beamlets onto a specimen; and
a detector device configured to detect secondary charged particles and/or backscattered charged particles emitted from the specimen.

12. The charged particle beam device of claim 11, wherein the objective lens is a combined magnetic-electrostatic objective lens including a magnetic lens portion and an electrostatic lens portion.

13. A charged particle beam influencing device, comprising:
an aperture device with a first number of apertures configured to create a first number of beamlets from a charged particle beam propagating along an optical axis (A), wherein the first number is five or more, wherein the apertures are arranged on a ring line around the optical axis (A) such that perpendiculars of the apertures onto a tangent of the ring line are evenly spaced; and
an electrostatic multipole device integrated with the aperture device and configured for individually influencing the beamlets, wherein the aperture device comprises a substrate on which electrostatic multipoles of the electrostatic multipole device are formed, and the electrostatic multipoles comprise four, six, eight, or more electrodes.

14. A method of operating a charged particle beam device, comprising:

generating a charged particle beam propagating along an optical axis (A);

directing the charged particle beam through a first number of apertures of an aperture device arranged on a ring line around the optical axis to create a first number of beamlets, wherein the first number is five or more;

individually influencing the beamlets with electrostatic multipoles of an electrostatic multipole device, wherein the aperture device comprises a substrate on which the electrostatic multipoles are formed, and the electrostatic multipoles comprise four, six, eight, or more electrodes; and moving the beamlets relative to a specimen in a first scan direction (X) along evenly spaced scan lines.

15. The method of claim 14, further comprising detecting secondary and/or backscattered charged particles emitted by the specimen.

16. The method of claim 14, wherein the secondary and/or backscattered charged particles generated by the beamlets are detected by respective detector segments of a detector device.

17. The method of claim 14, comprising: raster-scanning the specimen by moving the beamlets over the specimen in the first scan direction (X) and in a second scan direction perpendicular to the first scan direction.

18. The method of claim 14, wherein individually influencing the beamlets comprises at least one of individually deflecting, focusing and correcting the beamlets.

* * * * *